(12) United States Patent
Ledentsov et al.

(10) Patent No.: US 6,611,539 B2
(45) Date of Patent: Aug. 26, 2003

(54) WAVELENGTH-TUNABLE VERTICAL CAVITY SURFACE EMITTING LASER AND METHOD OF MAKING SAME

(75) Inventors: Nikolai Ledentsov, Berlin (DE); Vitaly Shchukin, Berlin (DE)

(73) Assignee: NSC Nanosemiconductor GmbH, Dortmund (DE)

( * ) Notice: Subject to any disclaimer, the term of this patent is extended or adjusted under 35 U.S.C. 154(b) by 71 days.

(21) Appl. No.: 09/867,167

(22) Filed: May 29, 2001

(65) Prior Publication Data

US 2002/0186726 A1 Dec. 12, 2002

(51) Int. Cl.$^7$ ............................................. H01S 3/10
(52) U.S. Cl. ........................... 372/20; 372/43; 372/45; 372/109
(58) Field of Search ........................... 372/20, 43, 45, 372/109; 257/98, 13

(56) References Cited

U.S. PATENT DOCUMENTS

| | | | |
|---|---|---|---|
| 5,541,945 A | | 7/1996 | Yamaguchi et al. .......... 372/20 |
| 5,812,581 A | * | 9/1998 | Cox ............................ 372/109 |
| 5,903,590 A | * | 5/1999 | Hadley et al. ................. 372/45 |
| 5,949,801 A | | 9/1999 | Tayebati ...................... 372/20 |
| 6,031,243 A | * | 2/2000 | Taylor .......................... 257/13 |
| 6,046,065 A | * | 4/2000 | Goldstein et al. ............. 372/43 |
| 6,064,683 A | * | 5/2000 | Johnson ........................ 372/43 |
| 6,088,376 A | * | 7/2000 | O'Brien et al. ............... 257/98 |
| 6,411,638 B1 | * | 6/2002 | Johnson et al. ............... 257/98 |

\* cited by examiner

*Primary Examiner*—Paul Ip
*Assistant Examiner*—Tuan M. Nguyen
(74) *Attorney, Agent, or Firm*—Brown & Michaels, PC

(57) ABSTRACT

A wavelength tunable semiconductor vertical cavity surface emitting laser which includes at least one active element including an active layer generating an optical gain by injection of a current, and at least one phase control element, and mirrors. The phase control element contains a modulator exhibiting a strong narrow optical absorption peak on a short wavelength side from the wavelength of the laser generation. The wavelength control is realized by using a position-dependent electro-optical effect. If a reverse bias is applied, the absorption maximum is shifted to longer wavelengths due to the Stark effect. If a forward bias is applied, a current is injected and results in the bleaching and reduction of the peak absorption. In both cases a strong modulation of the refractive index in the phase control element occurs. The effect tunes the wavelength of the cavity mode, and the sign and the value of the wavelength shift are defined by the position of the modulator. Two phase control cascades can be implemented into the laser, one of which shifts the wavelength of the emitted light to larger values, and the other shifts the wavelength of the emitted light to smaller values. A power equalizing element can be used in such laser allowing either to maintain the constant output power at different emission wavelengths or to realize an independent frequency and amplitude modulation. A photodetecting element can be implemented in the laser allowing calibration of the laser for all operations.

54 Claims, 15 Drawing Sheets

WAVELENGTH-TUNABLE VERTICAL CAVITY SURFACE EMITTING LASER AND METHOD OF MAKING SAME

BACKGROUND OF THE INVENTION

1. Field of the Invention

The invention pertains to the field of semiconductor devices. More particularly, the invention pertains to a wavelength tunable semiconductor vertical cavity surface emitting laser (VCSEL).

2. Description of Related Art

The wavelength tunable semiconductor laser plays an important role in wavelength division multiplexing transmission systems, wavelength division switching systems, wavelength cross-connection systems as well as in the field of optical measurements.

Prior art in this field includes far wavelength tunable edge-emitting lasers (M. Yamaguchi et al., U.S. Pat. No. 5,541,945) using different sections of the same waveguide structure of the device. Another way to achieve wavelength tunability for both edge- and surface emitting lasers is to use external mirrors or diffraction gratings, where the tuning is realized by mechanical tuning of the effective cavity length of the device (P. Tayebati, U.S. Pat. No. 5,949,801). In vertical cavity surface emitting lasers the tuning of the cavity length may be realized by using different microelectromechanical systems. The disadvantage of these devices is the long tuning time related to the mechanical nature of the effects used. Frequency-modulated signal transmission systems are not possible using this approach.

Therefore, there is a need in the art for better wavelength control and tuning.

SUMMARY OF THE INVENTION

A wavelength tunable semiconductor vertical cavity surface emitting laser which includes at least one active element including an active layer generating an optical gain by injection of a current, and at least one phase control element, and mirrors that can be realized, e.g., by distributed Bragg reflectors. The phase control element contains a modulator exhibiting a strong narrow optical absorption peak on a short wavelength side from the wavelength of the laser generation. The wavelength control is realized by using a position-dependent electro-optical effect. If a reverse bias is applied, the absorption maximum is shifted to longer wavelengths due to the Stark effect. If a forward bias is applied, a current is injected and results in the bleaching and reduction of the peak absorption. In both cases a strong modulation of the refractive index in the phase control element occurs. The effect tunes the wavelength of the cavity mode, and the sign and the value of the wavelength shift are defined by the position of the modulator. Two phase control cascades can be implemented into the laser, one of which shifts the wavelength of the emitted light to larger values, and the other shifts the wavelength of the emitted light to smaller values. A power equalizing element can be used in such laser allowing either to maintain the constant output power at different emission wavelengths or to realize an independent frequency and amplitude modulation. A photodetecting element can be implemented in the laser allowing calibration of the laser for all operations.

DETAILED DESCRIPTION OF THE INVENTION

In a vertical cavity surface emitting laser (VCSEL), an active region is generally put into a microcavity. An undoped or weakly doped active region is surrounded by n- and p-contact layers that are generally followed by mirrors.

The present invention teaches adding a phase control element. The phase control element is a modulator surrounded on both sides by undoped or weakly doped layers which are in turn surrounded by n- and p-contact layers. An electric field is used to the tune the refractive index of the modulator.

Therefore, the tunable vertical cavity surface emitting laser of the present comprises two primary elements: 1) an active region and 2) a phase control element above the active region. These primary elements are sandwiched between two mirrors. The active element and the modulator are surrounded by undoped, or weakly doped, layers surrounded by n- and p-contact layers. Either electric fields or injection currents are used to control and tune the laser.

The preferred embodiment of the invention provides a tunable laser with an active region and the phase control regions placed in different media. The tunable laser uses an effect of the refractive index control by tuning the resonant absorption optical spectrum by applying an electric field. Alternatively, the tunable laser can use the effect of the modulation of refractive index by injection of the current.

The wavelength of the emitted light and the output power can be tuned independently. The rate of the wavelength tuning is defined by the speed of electric field distribution in the phase control layer and may be in the picosecond range. The invention offers the possibility to realize wavelength-tunable vertical cavity surface-emitting lasers operating at frequencies up to approximately 50 GHz. The output power is equalized using weak absorption, selective in the frequency of light, which compensates the frequency-dependent absorption of light by the modulator.

Figure 1:
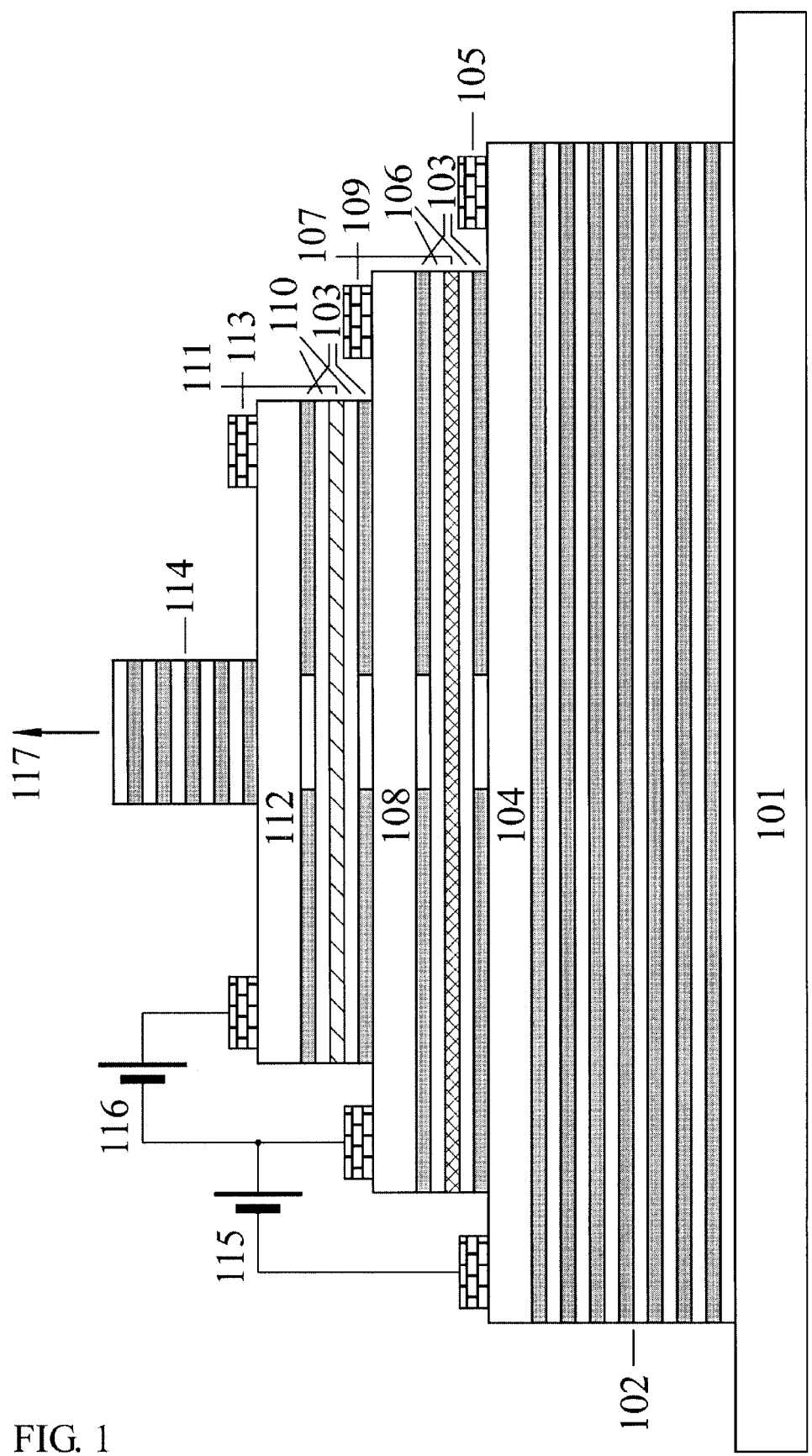
FIG. 1 shows a schematic diagram of one embodiment of a vertical cavity surface emitting laser of the present invention in which the active element, as usually operates under forward bias, and the phase control element operates under reverse bias.

Referring specifically to FIG. 1, a first example of a novel tunable vertical cavity surface emitting laser formed in accordance with the present invention is shown. The structure is grown epitaxially on the substrate (101). Bragg reflectors are used for the bottom mirror (102). The rest of the VCSEL comprises two primary elements: 1) an active element above the bottom mirror (102) and 2) a phase control element above the active region.

To form the active element, a current aperture (103) separates an n-doped current spreading layer (104), with a first metal contact (105), from the weakly doped layers (106) surrounding the active element (107). A second current aperture (103) separates the weakly doped layer (106) from a p-doped current spreading layer (108), with a second metal contact (109). The n-doped current spreading layer (104) sits directly on top of the bottom mirror (102).

To form the phase control element, two weakly doped layers (110) surrounding the modulator (111) are separated from the p-doped current spreading layer (108) by a third current aperture (103). A fourth current aperture separates the weakly doped layer (110) from a second n-doped current spreading layer (112), with a third metal contact (113). Distributed Bragg reflectors are also used for a top mirror (114) that is on top of the phase control element.

The active element operates under forward bias (115) as is typical for VCSEL's.

The novel component of the VCSEL is an additional phase control element that is shown in FIG. 1 being operated under reverse bias (116). The light comes out (117) through the top mirror (114).

The substrate (101) can be formed from any III–V semiconductor material or III–V semiconductor alloy, e.g. GaAs, InP, GaSb, or others. The preferred embodiment as used in the present invention is GaAs.

The n-doped layers (104) and (112) must be formed from the material lattice-matched or nearly lattice-matched to the substrate, transparent to the generated light, and doped by donor impurities. The preferred embodiment is the same material as that of the substrate, e.g. GaAs. Possible donor impurities include, but are not limited to S, Se, Te, and amphoteric impurities like Si, Ge, Sn where the latter are introduced under such technological conditions that they are incorporated predominantly into the cation sublattice and serve as donor impurities.

The p-doped layer (108) must be formed from a material, lattice-matched or nearly lattice-matched to the substrate, transparent to the generated light, and doped by an acceptor impurity. The preferred embodiment is the same material as the substrate, e.g. GaAs. Possible acceptor impurities include, but are not limited to Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The metal contacts (105), (109) and (113) can be formed from the multi-layered metal structures. Contacts to the n-doped layered, i.e. contacts (105) and (113) can be formed from, but not limited to the structure Ni—Au—Ge. Contacts to the p-doped layer, i.e. contacts (109) can be formed, but not limited to the structure Ti—Pt—Au.

The active element (107) can be formed by any insertion, the energy band gap of which is narrower than that of the substrate. Possible embodiments include, but are not limited to a single-layer or a multi-layer system of quantum wells, quantum wires, quantum dots, or their combination. In a case of the device on a GaAs-substrate preferred embodiments for the active element include, but are not limited to a system of insertions of InAs, $In_{1-x}Ga_xAs$, $In_xGa_{1-x-y}Al_yAs$, $In_xGa_{1-x}As_{1-y}N_y$, or similar.

The modulator (111) can be formed by any insertion, the energy band gap of which is narrower than that of a substrate. Possible materials and structures are same, as for an active element, but the particular design should be such, that the modulator (111) exhibits a strong absorption peak on a high-energy side (on a shorter wavelength side) from the wavelength of the laser radiation.

Each layer is separated from the neighboring layer by a current aperture (103) that works as a current blocking layer and can be formed from, but not limited to a Al(Ga)O layer or a proton bombardment layer.

Different designs for the bottom mirror (102) and for the top mirror (114) can be used, as described, e.g. in *Vertical-Cavity Surface-Emitting Lasers: Design, Fabrication, Characterization, and Applications* by C. W. Wilmsen, H. Temkin, L. A. Coldren (editors), Cambridge University Press, 1999. The preferred embodiment is a multi-layered dielectric mirror GaAs/AlGaO.

As an alternative, a different sequence of contacts can be used. The phase control element can comprise the n-contact layer, undoped or weakly doped layer, inside which a modulator (111) is inserted, and the p-contact layer. Then, the p-contact layer of the active element and the n-contact layer of the phase control element can be separated by a $p^+n^+$ Esaki tunnel junction.

The laser of the embodiment of FIG. 1 operates as follows. The electric field created by the reverse bias (116) is applied mainly to the undoped or weakly doped region (110). The modulator (111) is chosen to have a strong electrooptical effect. Under an external electric field controlled by the bias (116), the refractive index of the modulator (111) is tuned. The selection of the emission wavelength from the gain region of the optical spectrum is determined by the oscillation condition (H. C. Casey, Jr., and M. B. Panish, *Heterostructure Lasers*, Part A, Academic Press, N.Y. 1978). The optical path of the emitted electromagnetic wave includes the layer (104), the aperture, the layer (106) including the active region (107), the aperture, the layer (108), the aperture, the layer (110) including the modulator (111), the aperture, the layer (112), all paths doubled including also reflection from both the bottom and the top mirrors. A variation of the refractive index in the modulator (111), affects, first, the optical path of the light through the modulator (111), and, second, the transmission coefficient of the light from the medium (110) into the modulator (111) and back from the modulator (111) into the medium (110).

To demonstrate the effect of the refractive index modulation on the wavelength of the emitted light, a simple situation of a $1\lambda_m$- and of a $0.5\lambda_m$-microcavity bounded by ideally reflecting mirrors with a single-slab refractive index modulator (111) has been considered in detail (here $\lambda_m$ is the wavelength of the emitted light in the medium).

Figure 2:
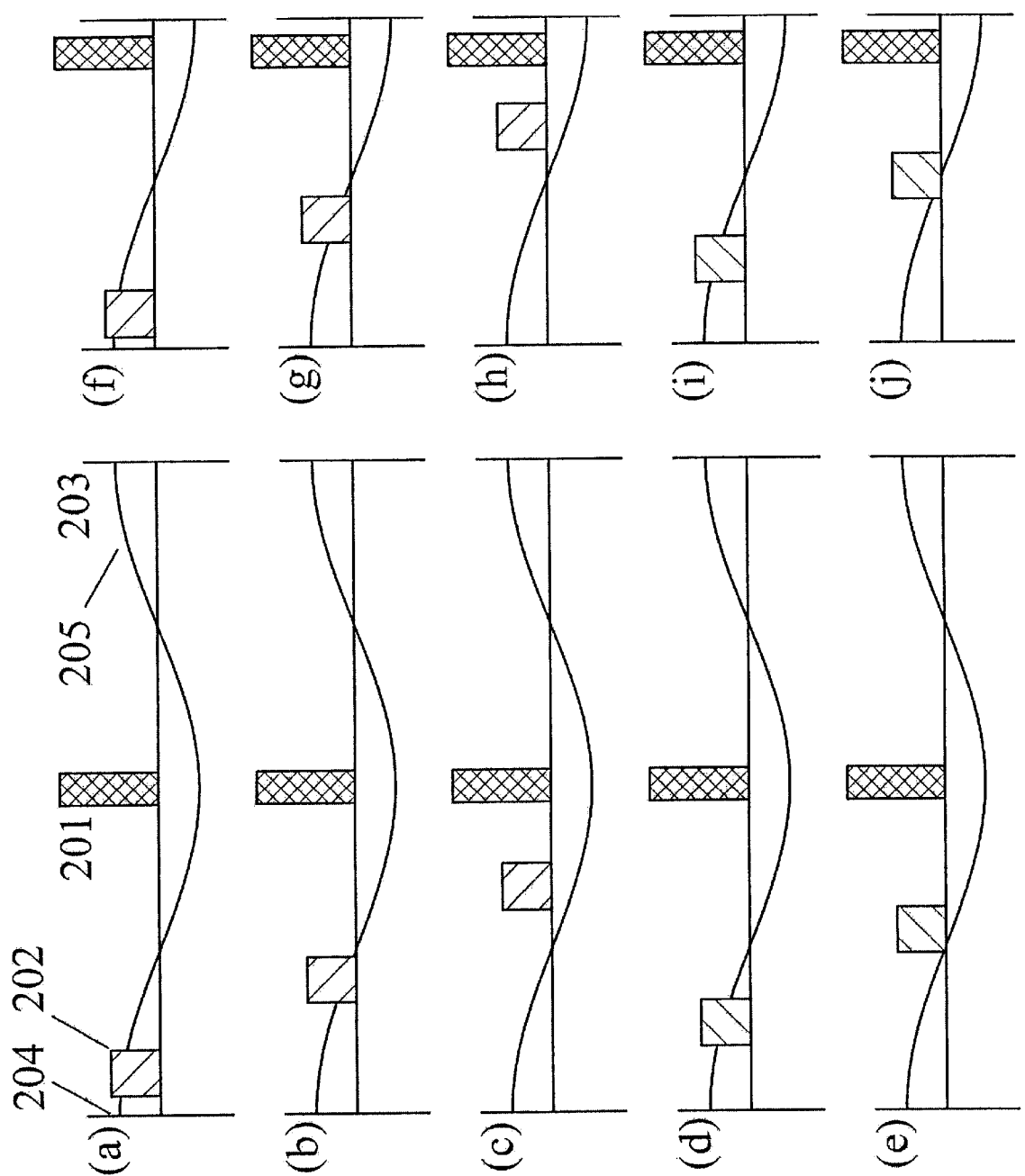
FIG. 2 shows a schematic diagram one embodiment of a vertical cavity surface emitting laser of the present invention illustrating, on two simple examples of a cavity, the preferred size and positions of a single-layer modulator providing the maximum shift of the wavelength of the emitted light.

FIG. 2 illustrates possible positions of the modulator (111) in a $1\lambda_m$- and of a $0.5\lambda_m$-microcavity bounded by ideally reflecting mirrors, at which they provide the maximum effect of the modulation of the wavelength of the emitted light. FIGS. 2(a)–2(e) refer to a $1\lambda_m$-microcavity, whereas FIGS. 2(f)–2(j) refer to a $0.5\lambda_m$-microcavity. The active layer (201) is placed in the maximum of the electric field in the microcavity mode. In this model, the mirrors (203) and (204) are ideally reflecting mirrors that promote the profile (205) of the electric field in the microcavity mode. FIGS. 2(a)–2(e) for a $1\lambda_m$-microcavity and FIGS. 2(f)–2(j) for a $0.5\lambda_m$-microcavity refer to different positions of the modulator (202).

The effect of both the thickness and the position of the modulator (202) on the wavelength of the emitted light have been investigated. Calculations are performed for the background refractive index $n_0=3.59$ (as in GaAs), the variation of the refractive index inside the modulator (202) being equal $\Delta n=+0.1$. Then the maximum effect is achieved for the modulator (202) having a thickness $0.07\lambda_m$, and such thickness of the modulator (202) refers to all the FIGS. 2(a)–2(j). FIGS. 2(a)–2(c) illustrate the positions of the modulator (202), for which the shift of the wavelength of the emitted light reaches its extreme positive value $\Delta\lambda/\lambda_0=+0.85\%$ (here $\lambda_0$ is the wavelength of the emitted light in the vacuum). FIGS. 2(d), 2(e) depict the positions of the modulator (202) for which the shift of the wavelength reaches its extreme negative value $\Delta\lambda/\lambda_0=-0.85\%$. A change of the direction of the hatching in the figures corresponds to the change of the sign of the shift of the wavelength of the emitted light. For any other position of the modulator (202) the shift of the wavelength has an intermediate value between the two extremes, this value changing gradually with the position of the modulator (202).

For a $0.5\lambda_m$ cavity the effect is doubled. The shift of the wavelength of the emitted light reaches the extreme positive value $\Delta\lambda/\lambda_0=+1.7\%$ for positions of the modulator (202) in FIGS. 2(f), 2(g), and 2(h), and the extreme negative value $\Delta\lambda/\lambda_0=-1.7\%$ for positions of FIGS. 2(i) and 2(j). For any other position the shift has an intermediate value between the two extremes, and the shift changes gradually as a function of the position of the modulator (202).

For any particular device design, like that of FIG. 1, the cavity mode and the effect of a modulator (111) on the emitted wavelength can be calculated by using the method by A. Yariv and P. Yeh (*Optical Waves in Crystals*, H. Wiley, N.Y., 1984, Chapter 6). In general, in a wider microcavity the effect of a single modulator (111) is weaker. However, it is possible to use several modulators (111), the number of which can be, but is not limited to, from 5 to 10. For any design of the laser, the optimization should be carried out of the number of modulators (111), the thickness and position of each of them.

In the present invention, the cavity-position dependent electrooptical effect is used for modulation of the refractive index. The modulator (111) is realized as an insertion exhibiting a sharp peak of the light absorption. According to the Kramers-Kronig relation, the refractive index exhibits a strong modulation near the absorption peak. This relation written for the real and imaginary part of the dielectric function $\varepsilon(\omega)=\varepsilon'(\omega)+i\varepsilon''(\omega)$ is as follows:

$$\varepsilon'(\omega) = \varepsilon_0 + \frac{1}{\pi} P \int \frac{\varepsilon''(\Omega)}{\Omega - \omega} d\Omega, \quad (1)$$

where $\varepsilon_0$ is the background dielectric constant, and P means the principal value of the integral. For convenience, this relation can be written in terms of the real and the imaginary parts of the refractive index $$n(\omega)=n'(\omega)+in''(\omega)=\sqrt{\varepsilon'(\omega)+i\varepsilon''(\omega)},$$

and the imaginary part of $n(\omega)$ can be written in terms of the absorption coefficient $\alpha(\omega)$. This yields the modulation of the real part of the refractive index as follows $$\Delta n(\omega) = \frac{\lambda_0}{4\pi^2} P \int \frac{\alpha(\Omega)}{\Omega - \omega} d\Omega. \quad (2)$$

For a narrow absorption peak, where absorption coefficient decreases rapidly, as a rule, exponentially at the long-wavelength side of the absorption line (Urbach's rule), the modulation of the refractive index outside the half-width can be written in a simple form:

$$\Delta n(\omega) \approx \frac{\lambda_0}{20} \times \frac{\alpha_{max}\Gamma}{\Omega_0 - \omega}, \quad (3)$$

where $\alpha_{max}$ is the peak absorption coefficient, $\Omega_0$ is peak position, and $\Gamma$ is the half-width of the absorption line at half-maximum. For a wavelength $\lambda_0=1$ $\mu$m, and the peak absorption coefficient $\alpha_{max}=10^5$ cm$^{-1}$, at the photon energy lower by 2–5 $\Gamma$ than the absorption peak, the modulation of the refractive index is of the order of 0.2–0.1. The preferred situation for the operation of the laser is that where the absorption peak is narrow. This allows the device to operate in the spectral region where the additional absorption due to the modulator (111) is rather weak, whereas the modulation of the refractive index, decreasing slowly away from the absorption peak, is rather strong.

Figure 3:
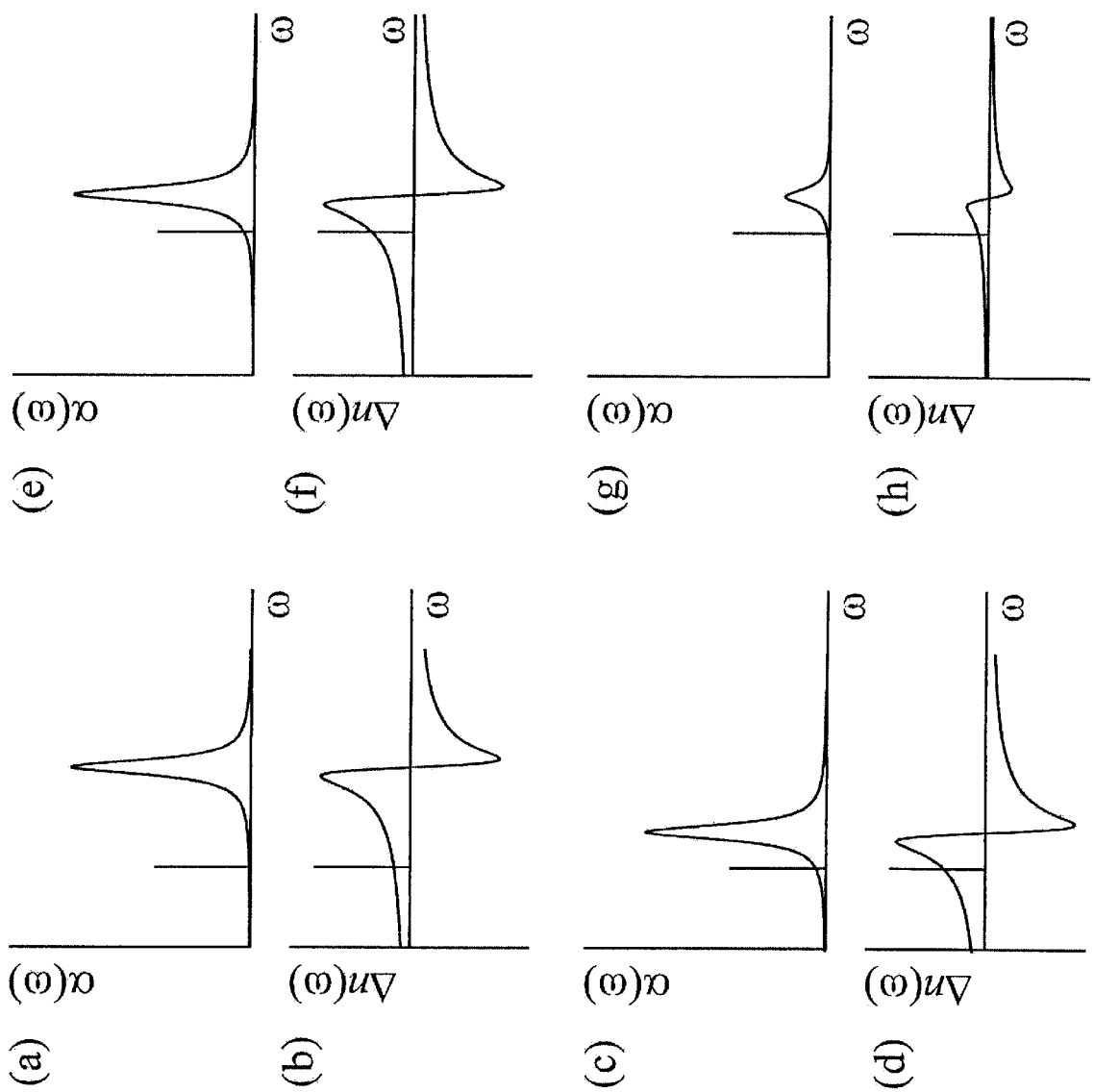
FIG. 3 shows a schematic diagram illustrating the behavior of the absorption coefficient of the modulator and of the refractive index in the vicinity of the absorption resonance at zero bias, at a reverse bias, and at a forward bias.

In the embodiment of FIG. 1 the reverse bias is applied to the second element which includes the phase control region (110) with the modulator(s) (111). The function of the modulator (111) is illustrated in FIG. 3. A sharp vertical line depicts the spectral line of the emitted light. In the absence of current the electric field is applied to the modulators (111). Due to the Stark effect, the energy levels are shifted to lower energies. The position of the absorption maximum (FIG. 3(a)) and the spectral region of the refractive index modulation (FIG. 3(b)) are shifted to lower photon energies (FIGS. 3(c) and 3(d), respectively). The modulator (111) can be realized, but not limited to, by a single quantum well, an array of uncoupled quantum wells, or an array of electronically coupled quantum wells. Typical experimental values of the line width of the exciton absorption peak and the shift of the peak position at a reverse bias for an array of uncoupled InGaAs/GaAs quantum wells (the half-width at half-maximum of the exciton absorption peak at room temperature of the order of 50 meV and the shift of the peak position at a reverse bias 12 V about 250 meV, L. Chen et al., *Appl Phys. Lett.* 57, 2478–2480 (1990)) illustrates the possibility of the realization of an efficient modulator (111) of the refractive index.

Within the preferred embodiment of FIG. 1, two complementary embodiments are possible. According to the effect illustrated in FIG. 2, the shift of the wavelength of the emitted light strongly depends on the particular position of the modulator (111). For an increased refractive index within the modulator (111), the wavelength of the emitted light can be shifted to both larger and smaller values. This is a unique property of the modulator (111), which makes it principally different from all other approaches. One embodiment implies that the modulators (111) are optimized in such a way to provide the largest shift of the wavelength to larger values. The other embodiment implies that the modulators (111) are optimized in such a way to provide the largest shift of the wavelength to smaller values.

Figure 4:
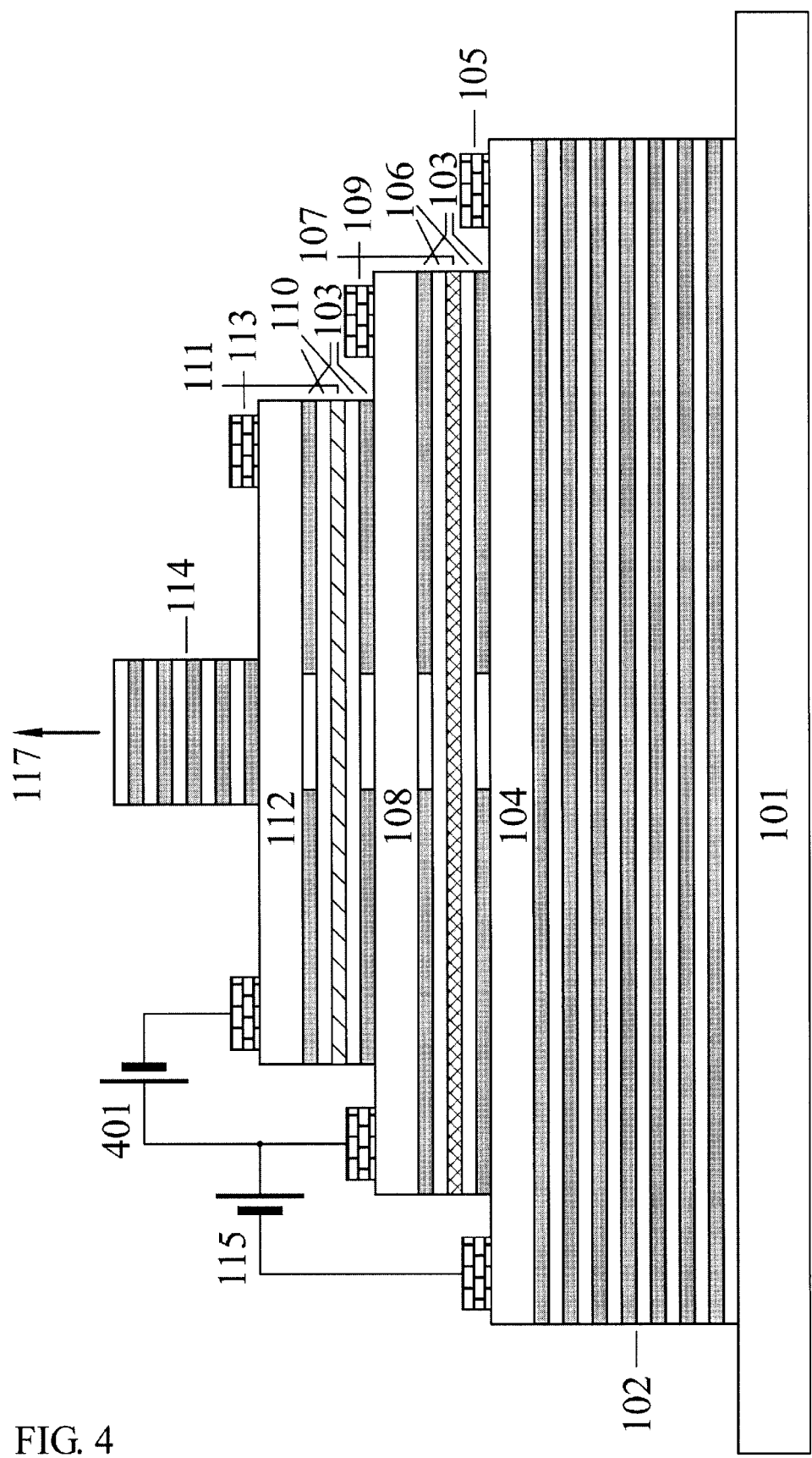
FIG. 4 shows a schematic diagram showing another embodiment of the present invention, in which the modulator operates at the forward bias.

Another embodiment is illustrated in FIG. 4, where a forward bias (401) is applied to the phase control element. Forward bias results in the injection of carriers in the phase control region, of electrons from the metal contact (113) through the n-doped layer (112) to the weakly doped layer (110) and the modulator (111), and of holes from the metal contact (109) through the p-doped layer (108) to the weakly doped layer (110) and the modulator (111). Recombination of carriers in the modulator (111) results in a bleaching thus reducing the exciton absorption peak, up to the vanishing of it and even creation the second gain region in the system. FIG. 3(g) and FIG. 3(h) illustrate the reduction of the absorption peak and the reduction of the refractive index modulation, respectively.

Figure 5:
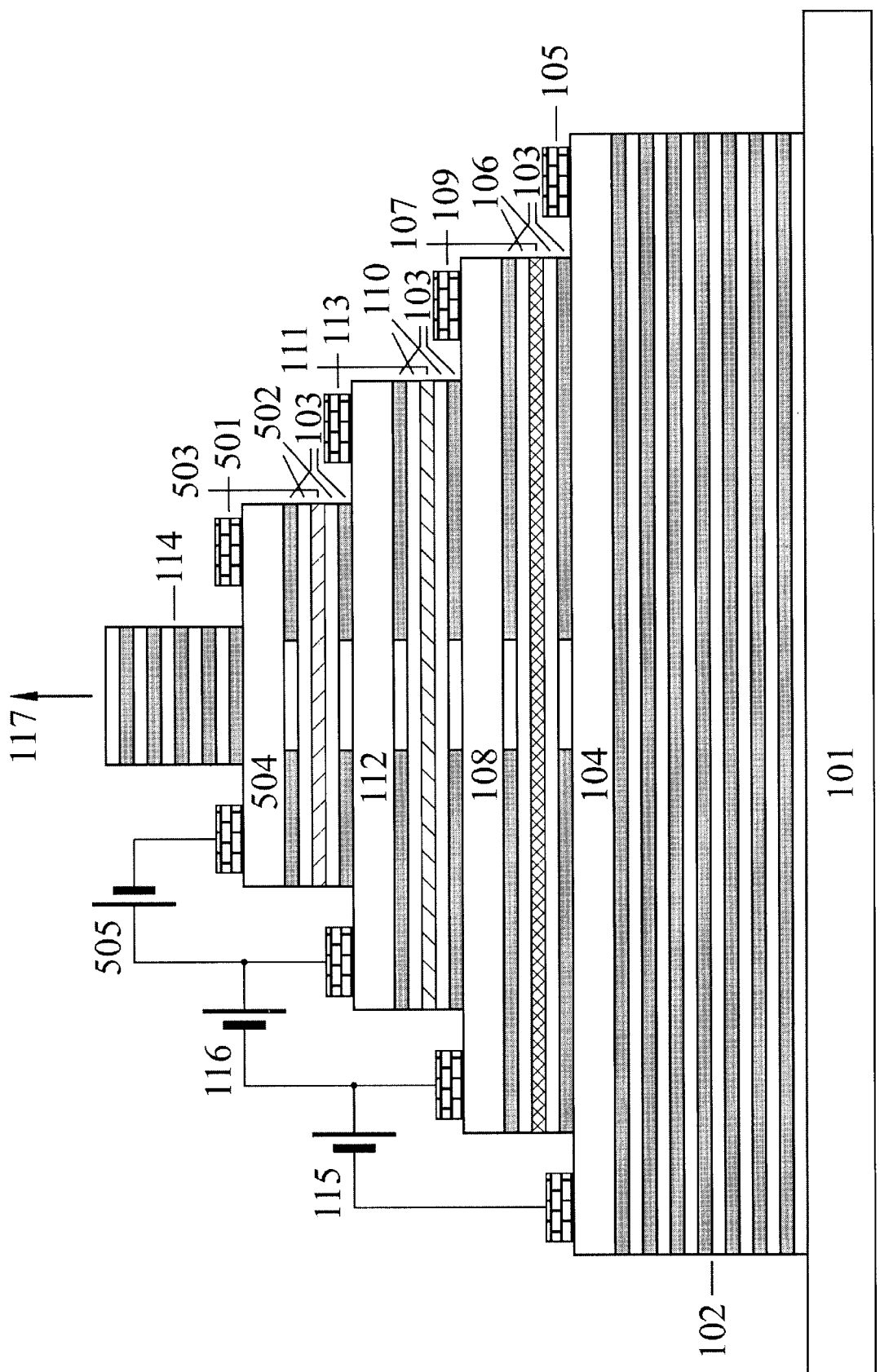
FIG. 5 shows a schematic diagram of another embodiment of the present invention, where the vertical cavity surface emitting laser comprises three elements, namely the active element, and two phase control cascades, where both phase control cascades operate at a reverse bias, but one of which is set to shift the wavelength to larger values, and the other of which is set to shift the wavelength of the emitted light to smaller values.

Another embodiment is illustrated in FIG. 5. This embodiment contains two phase-control cascades. In one of the cascades, e.g., in the layer (110), the modulator (111) is optimized in a way to provide the largest shift of the wavelength of the emitted light to larger wavelengths. In the other phase control cascade (502), the modulator (503) is optimized to provide the largest shift of the wavelength of the emitted light to shorter wavelengths. Each of the two phase control cascades operates under reverse bias (116) and (505), respectively. Independent operating of the two phase control cascades allows to shift the wavelength of the emitted light to both larger and smaller values.

The materials of the weakly doped layer (502) and of the p-doped layer (504) must be lattice-matched or nearly lattice-matched to the substrate and transparent to the emitted light. A preferred embodiment is a structure where the weakly doped layer is grown of the same material as (110), and the p-doped layer (504) is grown of the same material as the p-doped layer (108). The metal contacts (501) to the p-doped layer can be formed from the same structure as the metal contact (109).

The modulator (503) can be formed by any insertion, the energy band gap of which is narrower than that of a substrate. Possible materials and structures are the same as for the modulator (111), but the modulator (503) must be designed and positioned such that the modulator (503) provides the shift of the wavelength of the emitted light to shorter wavelengths.

Figure 6:
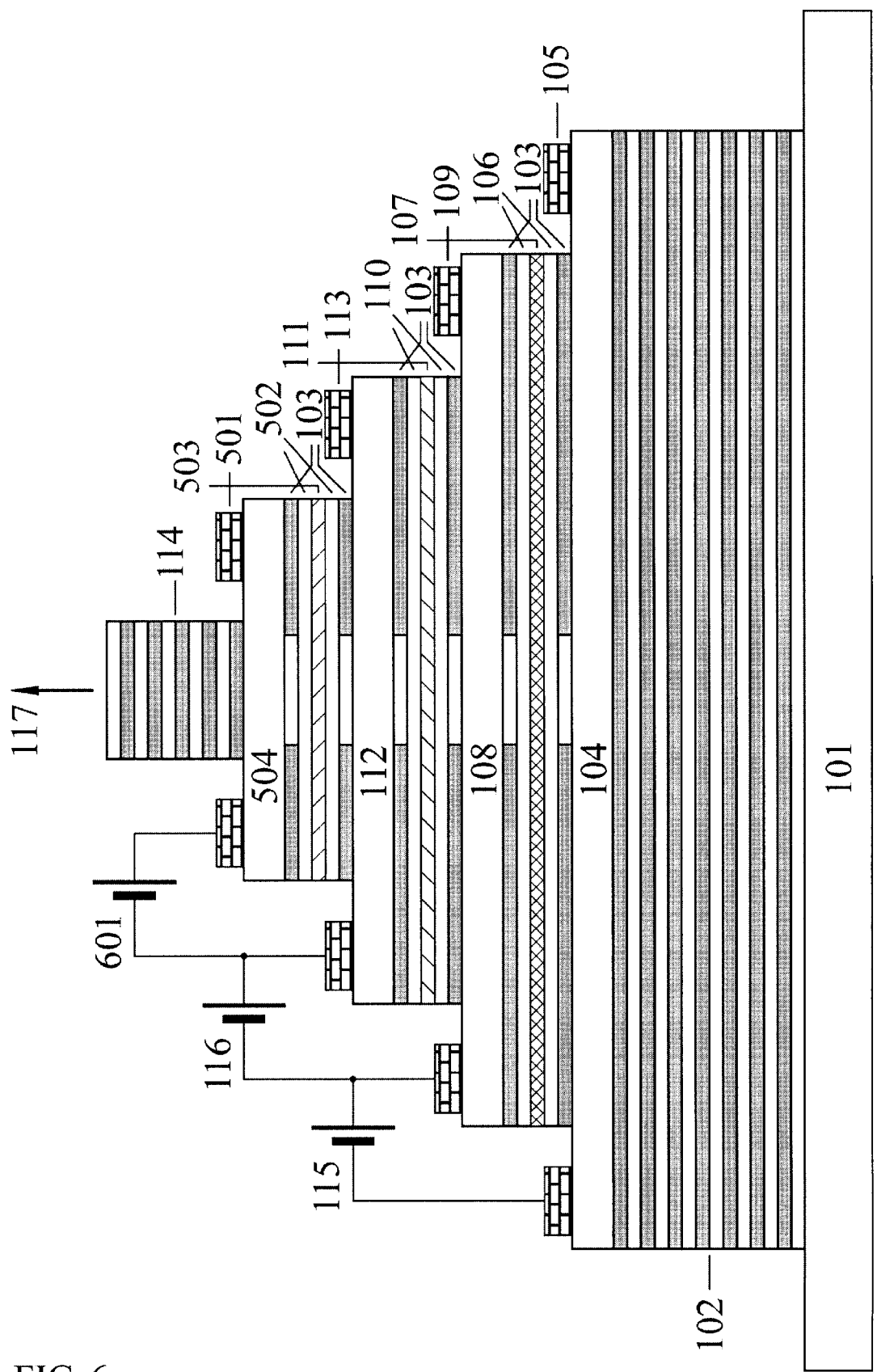
FIG. 6 shows a schematic diagram of an embodiment of the present invention, in which one phase control cascade operates under reverse bias, and the other phase control cascade operates under forward bias.

Another embodiment is depicted in FIG. 6. This embodiment, like that of FIG. 5, contains two phase control cascades. One cascade operates under reverse bias (116) and uses the Stark effect, and the other one operates under forward bias (601) and uses the effect of bleaching. This gives an alternative to the embodiment of FIG. 5 and allows the wavelength of the emitted light to be shifted to both larger and smaller values.

Figure 7:
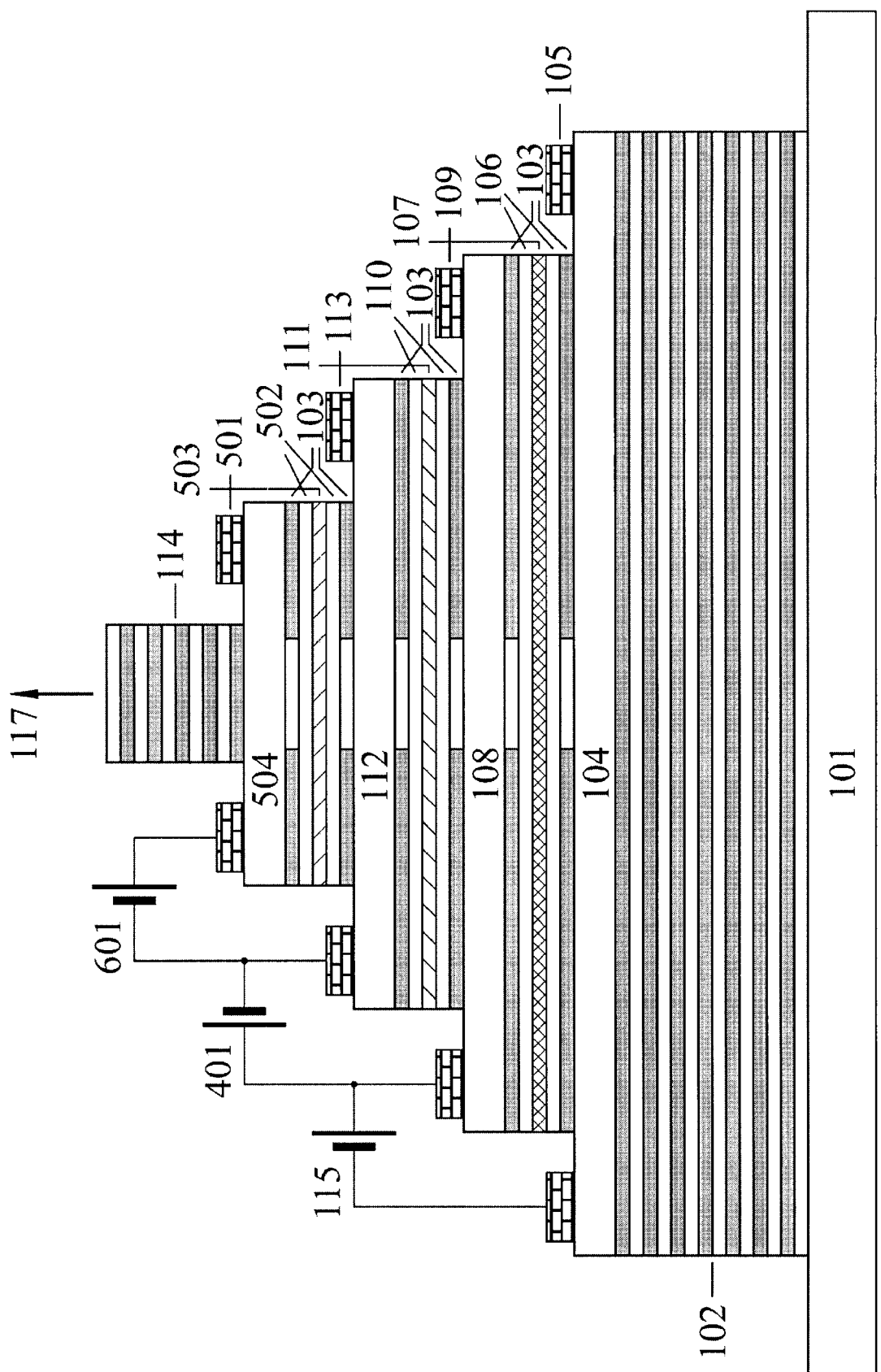
FIG. 7 shows a schematic diagram of an embodiment of the present invention, in which both phase control cascades operate under forward bias.

Another embodiment is depicted in FIG. 7. This embodiment contains two phase control cascades, both operating under forward bias, (401) and (601), respectively. This provides an alternative to the embodiments of both FIG. 5 and FIG. 6 and allows the wavelength of the emitted light to be shifted to both larger and smaller values. The embodiments shown in FIG. 5, FIG. 6, and FIG. 7 are all useful and the choice of which one to use will depend upon the intended application and standard optimization experimentation and selection known to those skilled in the art.

The second phase control elements of the embodiments of FIGS. 6 and 7 can be made of the same materials as those of the embodiment of FIG. 5.

Modulation of the refractive index in the modulator (111) based on the Stark effect is accompanied by the enhancement of the light absorption by the modulator (111). This effect is not very important, if the mirrors are designed to provide significant external losses, i.e. larger than the absorption losses of the phase control element. Otherwise, another embodiment shown in FIG. 8 contains an equalizing element, which comprises an intrinsic or weakly doped layer (802) inside which an equalizer (803) is inserted and of a p-doped layer (804). This element operates under reverse bias (805).

Figure 9:
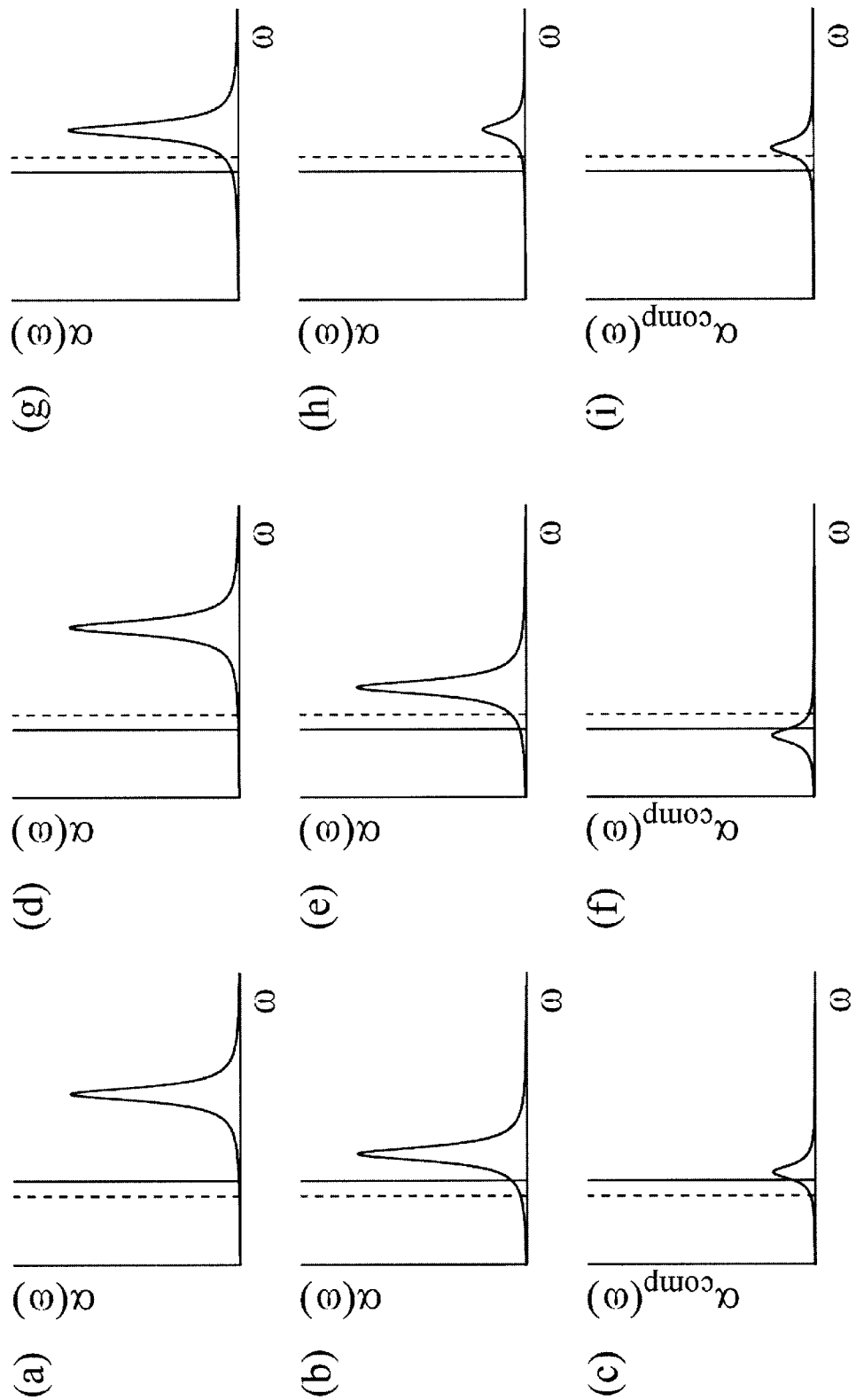
FIG. 9 shows a schematic diagram of the absorption spectra of the modulator and of the power equalizing element of different embodiments.

The principle of equalizing is illustrated in FIG. 9. The sharp solid vertical line in all the FIGS. 9(a)–9(i) depicts the spectral line of the emitted light at zero bias. The sharp dashed vertical line in all the figures corresponds to the spectral line of the emitted light at non-zero bias.

Figure 8:
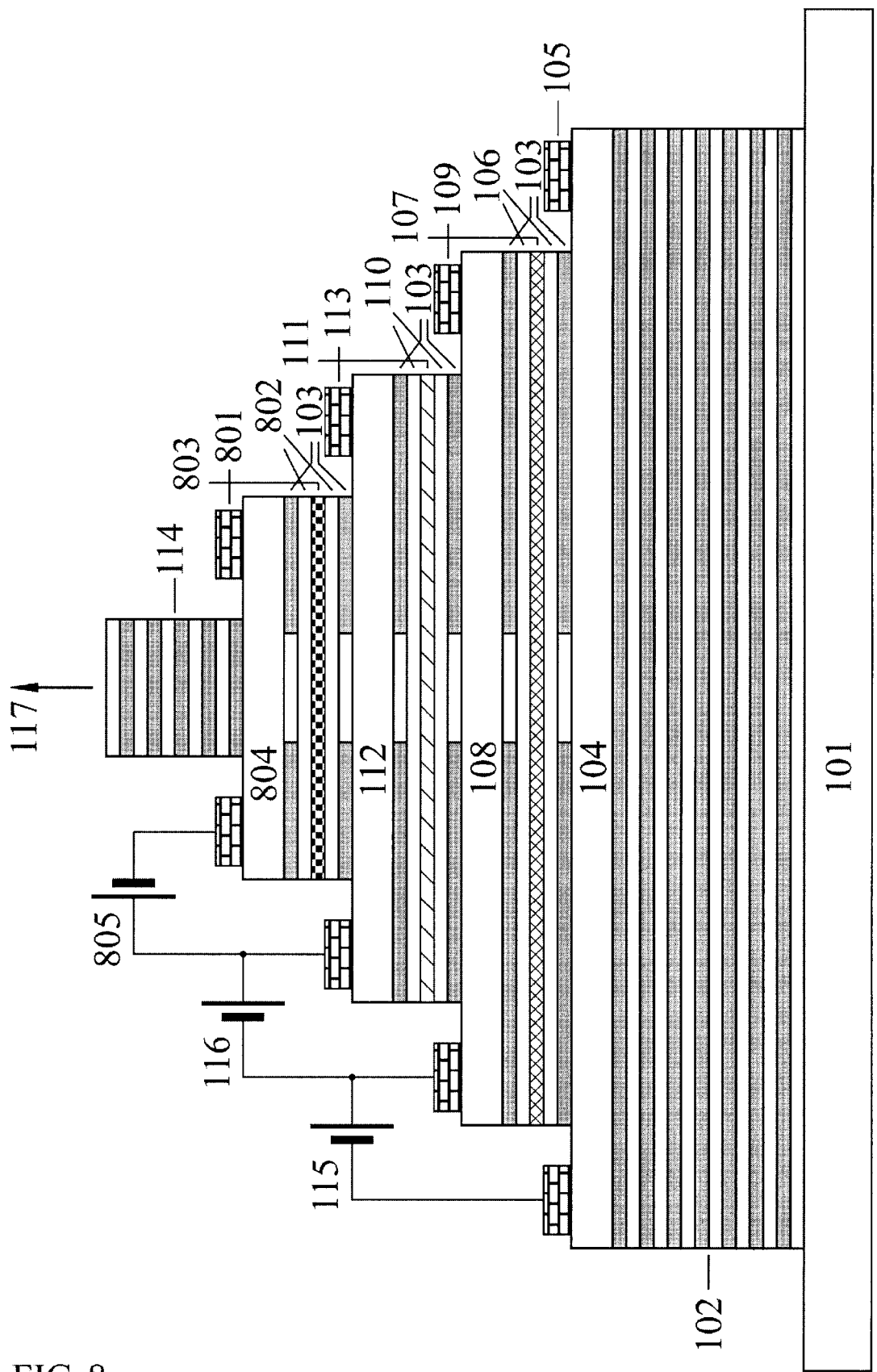
FIG. 8 shows a schematic diagram of another embodiment of the present invention where there are three elements, the active element, the phase control element and the power equalizing element is added.

Considering the operation of the embodiment of FIG. 8 where the modulator (111) is arranged in such a way that the increase of the refractive index of the modulator (111) leads to a shift of the wavelength of the emitted light to larger values (a red shift). When the phase control element formed by doped layers (108) and (112) and undoped layers (110) surrounding the modulator (111) is unbiased, the absorption spectrum of the modulator (111) is that of FIG. 9(a). Under a reverse bias (116), the absorption spectrum of the modulator (111) is shifted to lower photon energies (FIG. 9(b)), thus increasing the internal losses of the emitted light. The absorber layer (803) is used to equalize internal losses at different wavelengths of the emitted light. The absorption coefficient of layer (803) is depicted in FIG. 9(c). The absorption coefficient of the equalizer (803) at its maximum is much smaller than that of the modulator (111), which is illustrated in FIGS. 9(c),9(f), and 9(i) by a relative scale of the absorption spectrum as compared to the other FIGS. 9(a),9(b),9(d),9(e),9(g), and 9(h). Since the absorption of the equalizer (803) at its maximum is rather small, its influence on the refractive index is negligible and can be ignored. The equalizer (803) is designed in such a way that the maximum of its absorption coefficient (that of FIG. 9(c)) is shifted to larger photon energies with respect to the photon energy of the emitted light at zero bias (116). When, under a reverse bias (116), the spectrum of the emitted light is shifted to lower photon energies, the absorption of light by the equalizer (803) decreases. Since the spectral line of the emitted light is close to the maximum of the absorption spectrum of the equalizer (803) and at the same time more significantly shifted from the maximum of the absorption spectrum of the modulator (111), the actual absorption by the modulator (111) and by the equalizer (803) are of the same order of magnitude. It means, that it is indeed possible, by the particular design of the equalizer (803), to compensate for an increased absorption by the modulator (111) by a decreased absorption of the equalizer (803).

If the modulator (111) is designed in a way that the increase of the refractive index leads to the decrease of the wavelength of the emitted light, i.e. to the blue shift of the emitted light, the equalizer (803) can be designed to have the absorption spectrum as that of FIG. 9(*f*). When a reverse bias (116) is applied to the modulator (111), the absorption peak of the modulator (111) shifts to the lower photon energies (FIG. 9(*e*)), the refractive index of the modulator (111) increases, and the spectrum of the emitted light shifts towards larger photon energies. The absorption of light by the modulator (111) increases whereas the absorption of light by the equalizer (803) decreases, thus equalizing the output power of the laser.

In general, the equalizer (803) can be designed to have the absorption maximum at higher photon energies at zero bias, and the position of the absorption maximum can be shifted to lower energies by applying the reverse bias (805).

Figure 10:
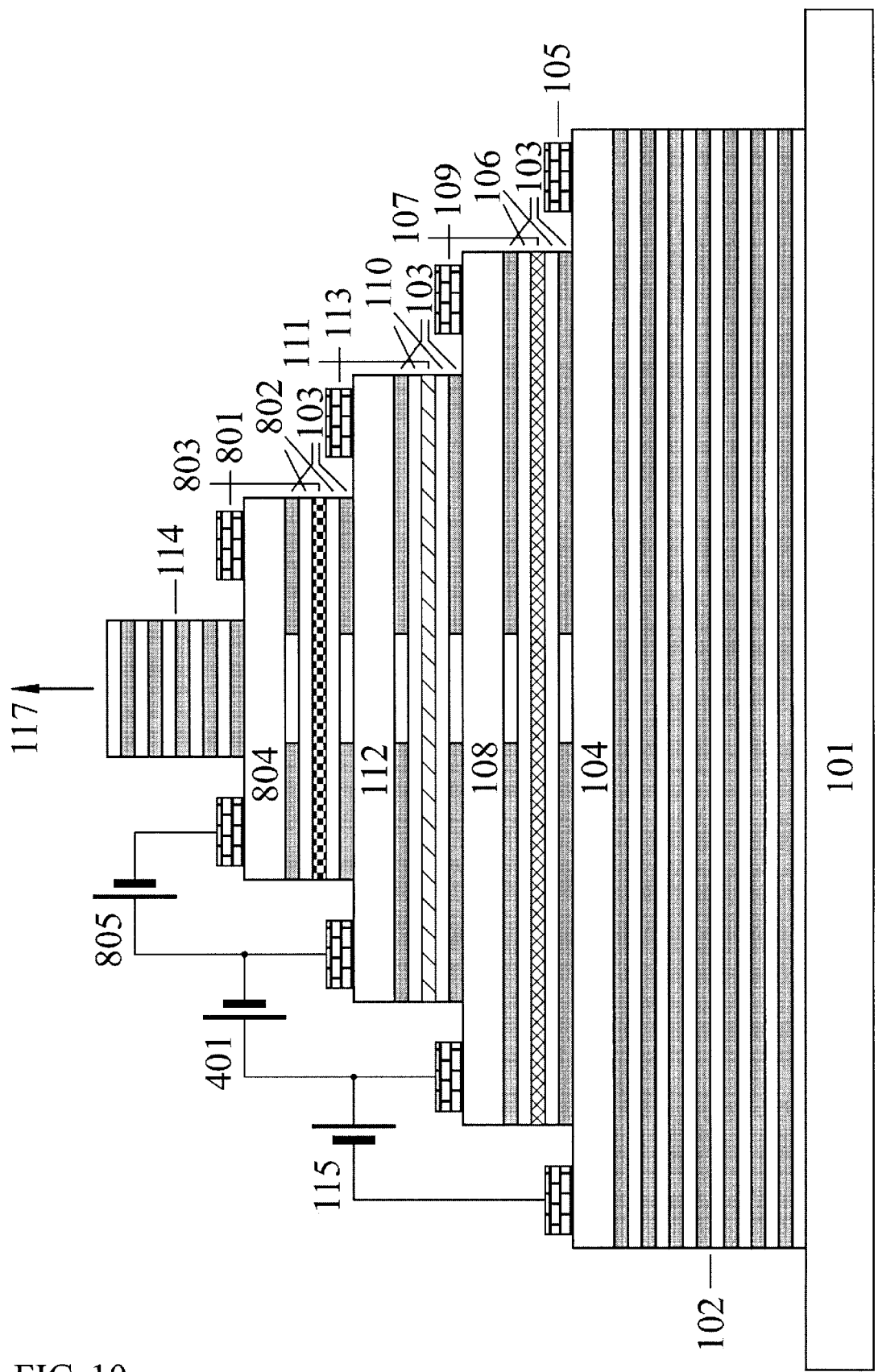
FIG. 10 shows a schematic diagram of an embodiment of the present invention in which, distinct from the embodiment of FIG. 8, the phase control element operates under forward bias.

Another embodiment shown in FIG. 10 uses the modulator (111) operating under forward bias (401) and an equalizer (803). The bleaching and the reduction of the absorption in the modulator (111) (see FIG. 9(*h*)) are accompanied by the decrease of the refractive index of the modulator (111). The modulator (111) is designed in such a way, that the spectral line of the emitted light is shifted (when Δn<0) to higher photon energies. Then the light absorption by the equalizer (803) is increased (FIG. 9(*i*)) that compensates the decrease of the light absorption of the modulator (111) due to bleaching.

Similar to the embodiment shown in FIG. 8, the absorption maximum of the equalizer (803) at zero bias (805) can be placed at higher photon energies, and shifted to lower energies by applying reverse bias (805).

Another embodiment, similar to those of FIG. 8 and FIG. 10 can use the equalizer (803) as an amplitude modulator (111). The design is the same, but the operation of the bias applied to the power equalizer (803) element results in the desirable modulation of the output power. Thus, the embodiments of FIG. 8 and FIG. 10 can be used for separate frequency and amplitude modulation.

For all embodiments, like those of FIG. 8 and FIG. 10, containing the equalizing element, both the weakly doped layer (802) and the p-doped layer (804) must be lattice-matched or nearly lattice-matched to the substrate and transparent to the emitted light. The preferred embodiment is a structure where the weakly doped layer (802) is grown of the same material as (110), and the p-doped layer (804) is grown of the same material as the p-doped layer (108). The metal contacts (801) to the p-doped layer can be formed from the same structure as the metal contact (109).

The equalizer (803) can be formed by any insertion, the energy band gap of which is narrower than that of a substrate. Possible materials and structures are same, as for the modulator (111), but the equalizer (803) must be designed such that the absorber provides the desired absorption spectrum, e.g. as one of those shown schematically in FIGS. 9(*c*), 9(*f*) or 9(*i*).

Figure 11:
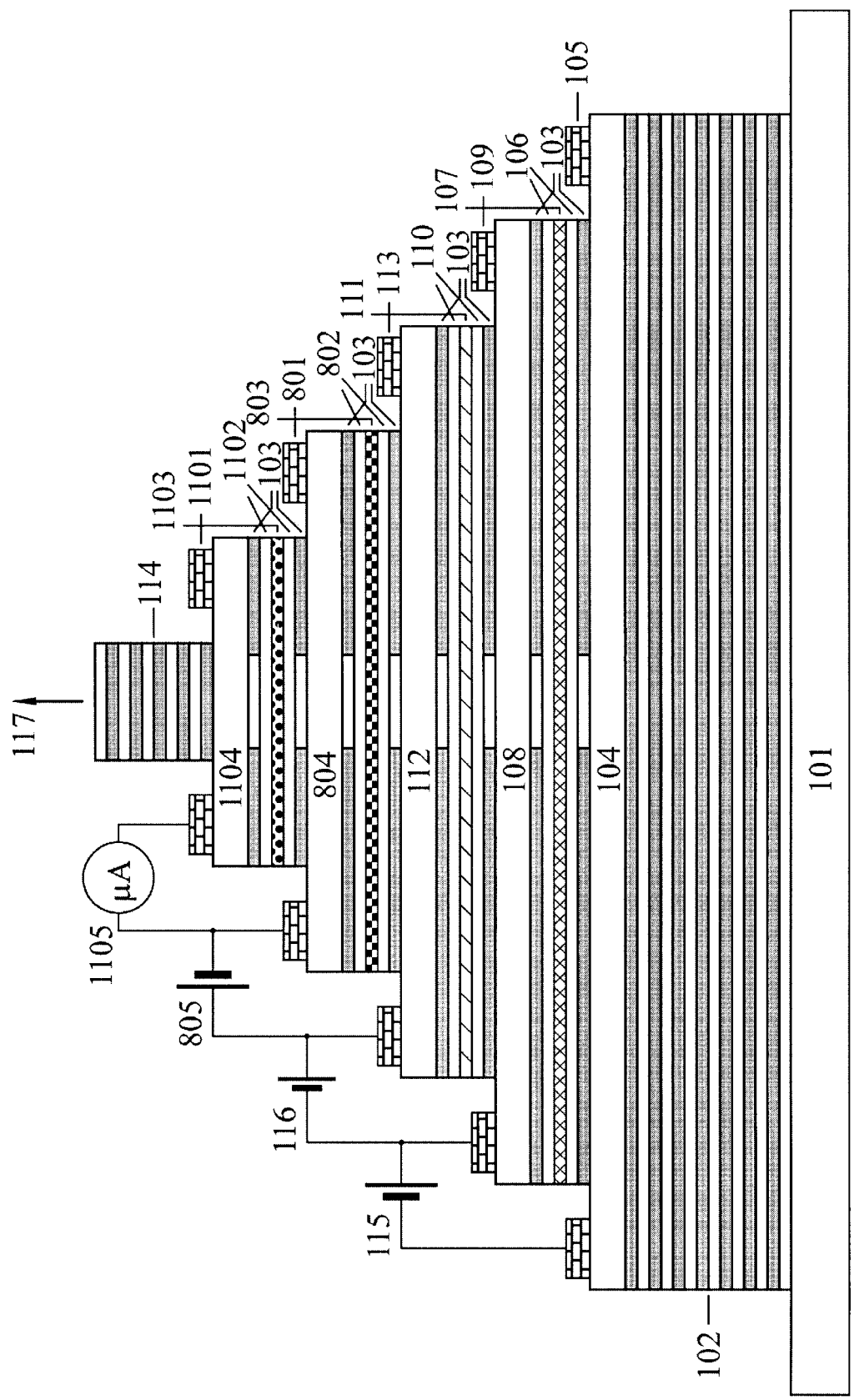
FIG. 11 shows a schematic diagram of an embodiment of the present invention comprising the active element, the phase control element, the power equalizing element, and a fourth photodetecting element.

Another embodiment is shown in FIG. 11 and is similar to the embodiments shown in FIG. 8 and FIG. 10, but includes a fourth element which is used as the photodetector to measure the output power and thus to calibrate the laser for all operations. This element operates as a standard photodetector. It absorbs emitted light and creates electric current in the circuit, that is measured by the microampermeter (1105).

A weakly doped layer (1102) and an n-doped layer (1104) must be lattice-matched or nearly lattice-matched to the substrate and transparent to the emitted light. A preferred embodiment is a structure where the weakly doped layer (1102) is grown from the same material as (110), and the n-doped layer (1104) is grown from the same material as the n-doped layer (104). The metal contact (1101) to the n-doped layer can be formed from, but is not limited to the same structure as the metal contact to the n-doped layer (105). The absorber (1103) can be formed from any insertion, which absorbs the emitted light.

Figure 12:
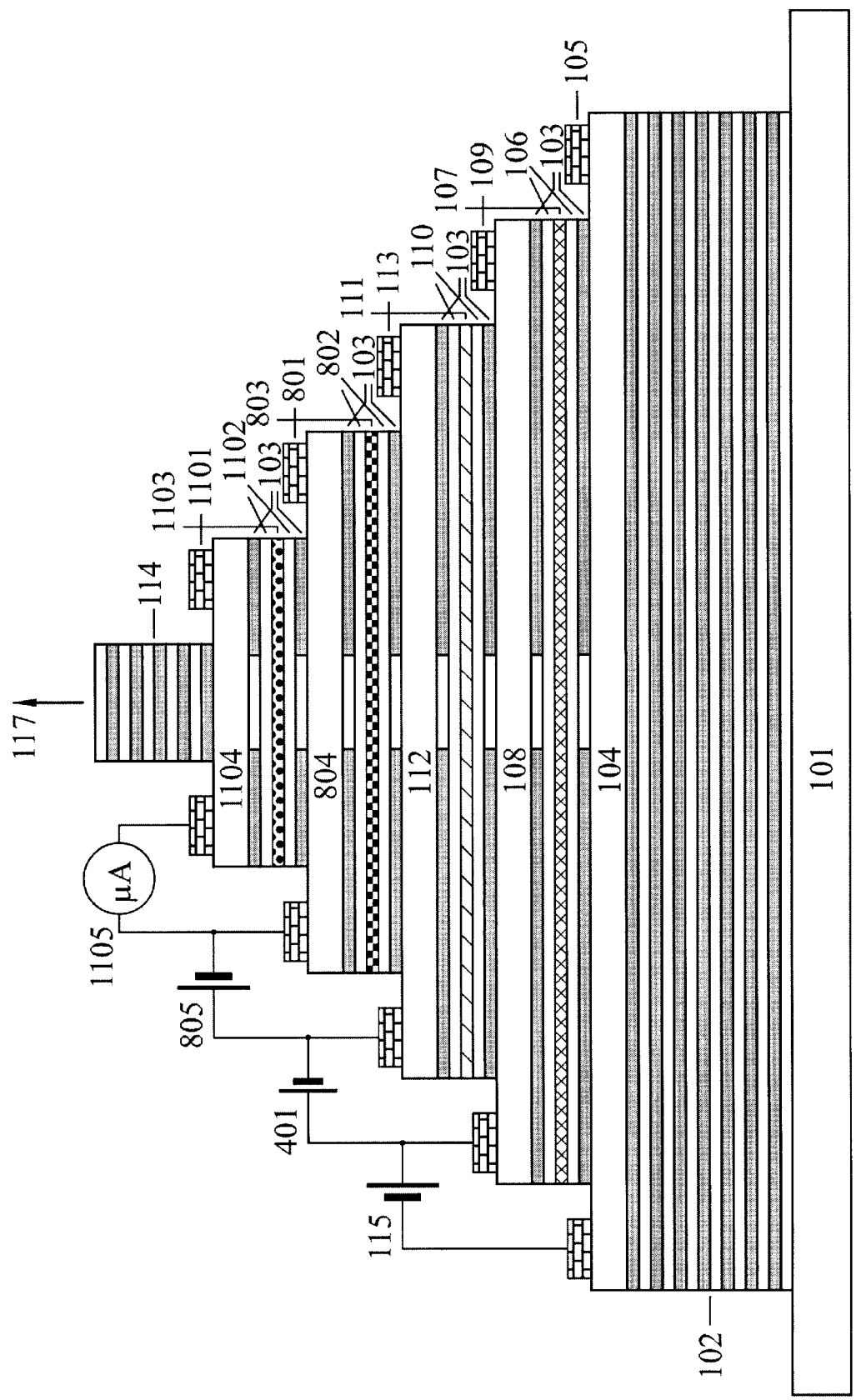
FIG. 12 shows a schematic diagram of another embodiment of the present invention, in which the phase control element operates under forward bias.

Another embodiment is shown in FIG. 12 and comprises the four elements of FIG. 11, but the modulator (111) operates under forward bias (401) and the modulation effect is based on the bleaching.

Figure 13:
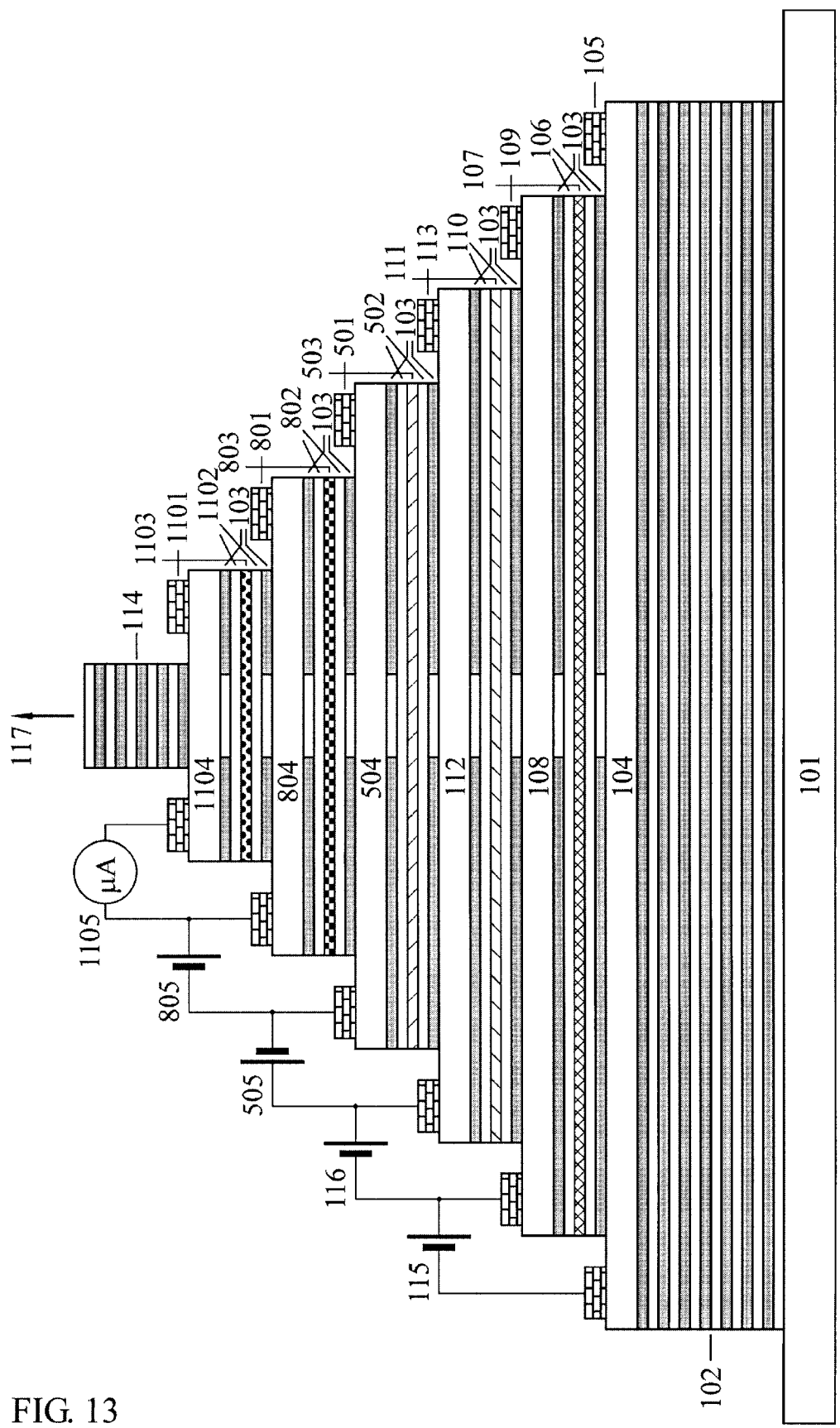
FIG. 13 shows a schematic diagram of another embodiment of the present invention comprising the active element, two phase control cascades, shifting the wavelength to larger and to smaller values, respectively, the power equalizing element, and the photodetecting element.
Figure 14:
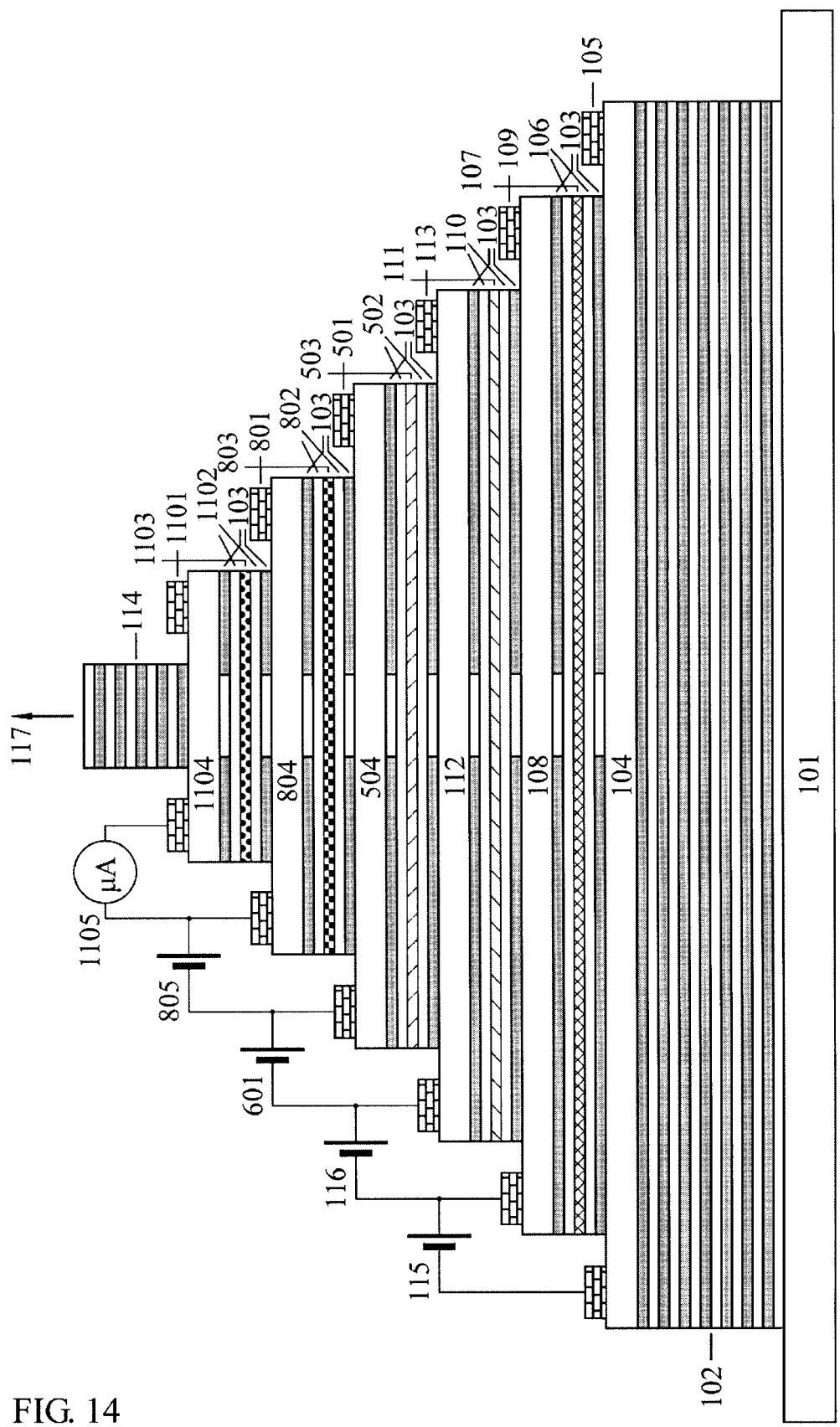
FIG. 14 shows a schematic diagram of another embodiment of the present invention comprising five elements, where one phase control cascade operates under reverse bias, and the other phase control cascade operates under forward bias.
Figure 15:
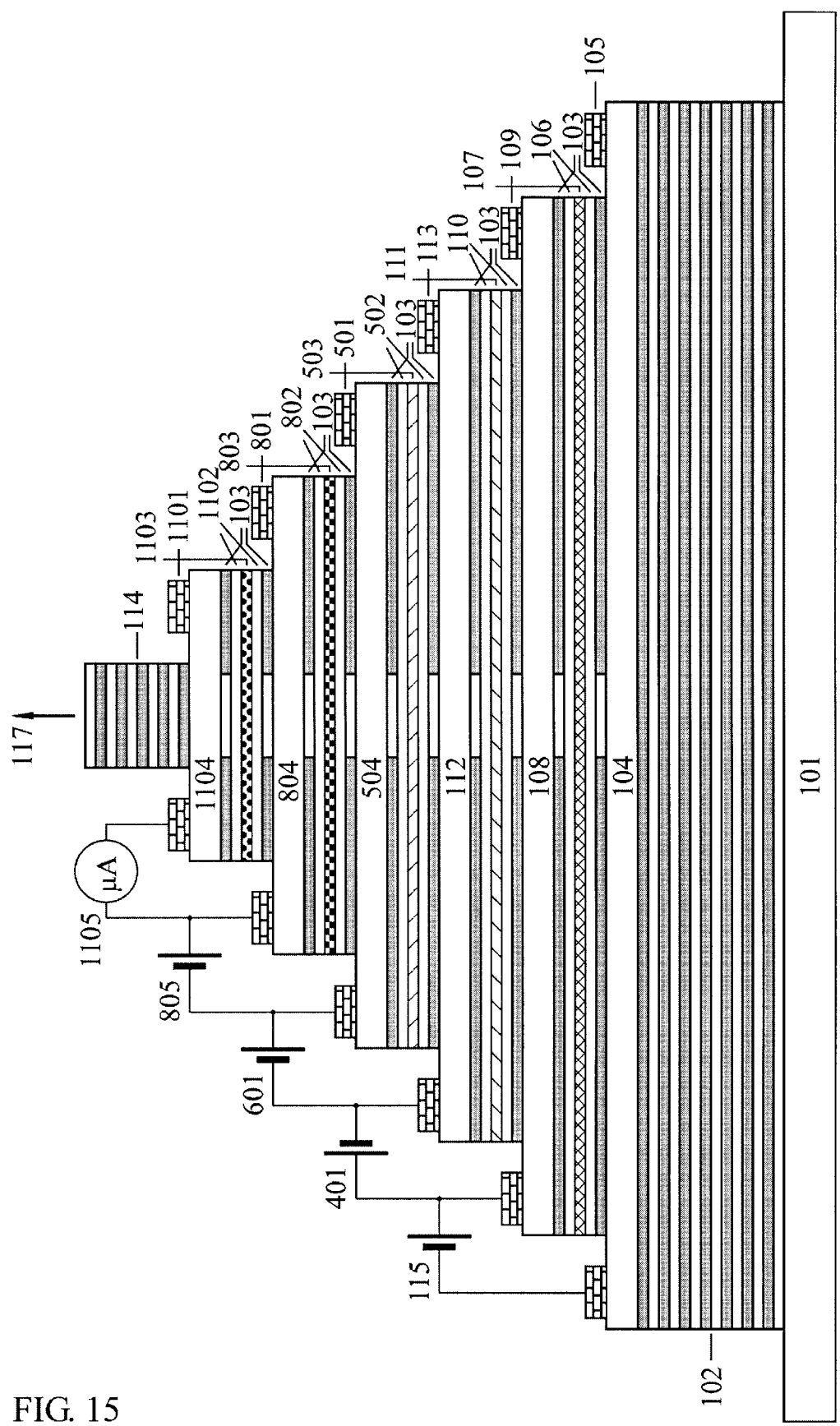
FIG. 15 shows a schematic diagram of another embodiment of the present invention comprising five elements, where both phase control cascades operate under forward bias.

Another embodiment is shown in FIG. 13 and comprises five elements, namely the active element, two phase control cascades, one of which, under an applied reverse bias, shifts the wavelength of the emitted light to larger values, and the other, under an applied reverse bias shifts the wavelength of the emitted light to smaller values, a power equalizing element, and a photodetecting element. Another embodiment is shown in FIG. 14 and comprises the five elements shown in FIG. 13, however, one phase control cascade operates under reverse bias, and the other phase control cascade operates under forward bias. Another embodiment is shown in FIG. 15 and comprises the five elements shown in FIG. 13, however, both phase control cascades operate under forward bias.

For each of the described embodiments the preferred sequence of the elements, the thickness of each layer, the design of modulators (111), power equalizer (803), photodetector, and mirrors should be obtained as a result of the optimization providing the preferred interplay between the maximum tunability of the wavelength of the emitted light and the maximum output power.

Further embodiments are possible containing more than one active element, or more than one phase control element shifting the wavelength of the emitted light to larger values, or more than one phase control element shifting the wavelength of the emitted light to smaller values, or more than one power equalizing element, or more than one photodetecting element, where the sequence of elements can also be arbitrary. Besides that, further embodiments are possible where more than one function is realized by one element. In further embodiments, the n-doped layers and p-doped layers can be interchanged with respect to the above described embodiments. For contact layers, current apertures, mirrors and contacts a design different from the above described ones can be used. In a further embodiment the spectral position of the line of the laser radiation, on the one hand, and the spectral position of the absorption spectra of the modulator (modulators) can be interchanged so that the modulator exhibits a strong narrow absorption spectrum at the long wavelength side from the spectral line of the laser radiation. Besides that, a photodetecting element can be operatively connected to a bias control device(s) of more than one elements of the laser.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A wavelength tunable semiconductor vertical cavity surface emitting laser comprising:
   a) a substrate;
   b) a bottom mirror formed by a Bragg reflector region above the substrate;
   c) an active element that includes:
      i) a light generating layer that emits light when exposed to an injection current when a forward bias is applied,
      ii) a first n-doped current spreading region above the substrate and below the light generating layer,
      iii) a first p-doped current spreading region above the light generating layer,
      iv) a first current aperture placed between each neighboring region, and
      v) an active element bias control device between the n-doped current spreading region and the p-doped current spreading region such that current can be injected into the light generating layer to generate light;
   d) a phase control element that includes:
      i) a modulating layer located above the first p-doped current spreading region that modulates the wavelength of light when exposed either to an electric field when a reverse bias is applied, or to an injection current when a forward bias is applied due to position-dependent electro-optical effect,
      ii) a second n-doped current spreading region above the modulating layer,
      iii) a second current aperture placed between each neighboring region, and
      iv) a phase control element bias control device between the second n-doped current spreading region and the first p-doped current spreading region such that an electrical field can be created that causes the modulating layer to modulate the wavelength of light; and
   e) a top mirror formed by a Bragg reflector region above the second n-doped current spreading region.

2. The wavelength tunable semiconductor vertical cavity surface emitting laser of claim 1 further comprising a photodetecting element capable of measuring the output of light from the laser.

3. The wavelength tunable semiconductor vertical cavity surface emitting laser of claim 2 wherein the photodetecting element is operatively connected to the active element bias control device such that output of the active element is responsive to the measurement of the output of light from the laser.

4. The wavelength tunable semiconductor vertical cavity surface emitting laser of claim 2 wherein the photodetecting element is operatively connected to the phase control element bias control device such that the modulation of the phase control element is responsive to the measurement of the output of light from the laser.

5. The wavelength tunable semiconductor vertical cavity surface emitting laser of claim 3 wherein the photodetecting element is operatively connected to the phase control element bias control device such that the modulation of the phase control element is responsive to the measurement of the output of light from the laser.

6. The wavelength tunable semiconductor vertical cavity surface emitting laser of claim 1 wherein the active element bias control device applies a forward bias.

7. The wavelength tunable semiconductor vertical cavity surface emitting laser of claim 1 wherein the phase control element bias control device applies a reverse bias.

8. The wavelength tunable semiconductor vertical cavity surface emitting laser of claim 1 wherein the phase control element bias control device applies a forward bias.

9. The wavelength tunable semiconductor vertical cavity surface emitting laser of claim 7 wherein the phase control element is set to shift the wavelength of the emitted light towards longer wavelengths.

10. The wavelength tunable semiconductor vertical cavity surface emitting laser of claim 7 wherein the phase control element is set to shift the wavelength of the emitted light towards shorter wavelengths.

11. The wavelength tunable semiconductor vertical cavity surface emitting laser of claim 8 wherein the phase control element is set to shift the wavelength of the emitted light towards longer wavelengths.

12. The wavelength tunable semiconductor vertical cavity surface emitting laser of claim 8 wherein the phase control element is set to shift the wavelength of the emitted light towards shorter wavelengths.

13. The wavelength tunable semiconductor vertical cavity surface emitting laser of claim 1 further comprising:
   f) an equalizer element that includes:
      i) an absorbing layer that absorbs light and is located above the second n-doped current spreading region,
      ii) a second p-doped current spreading region above the absorbing layer,
      iii) a third current aperture placed between each neighboring region, and
      iv) an equalizer element bias control device between the second n-doped current spreading region and the second p-doped current spreading region such that an electrical field can be created when a reverse bias is applied, or a current can be injected, when a forward bias is applied, that causes the absorbing layer to generate variations of the absorption coefficient in response to the electrical field or to the current.

14. The wavelength tunable semiconductor vertical cavity surface emitting laser of claim 13 wherein the equalizer element bias control device applies a reverse bias.

15. The wavelength tunable semiconductor vertical cavity surface emitting laser of claim 13 wherein the equalizer element bias control device applies a forward bias.

16. The wavelength tunable semiconductor vertical cavity surface emitting laser of claim 13 further comprising a photodetecting element capable of measuring the output of light from the laser.

17. The wavelength tunable semiconductor vertical cavity surface emitting laser of claim 16 wherein the photodetecting element is operatively connected to the active element bias control device such that output of the active element is responsive to the measurement of the output of light from the laser.

18. The wavelength tunable semiconductor vertical cavity surface emitting laser of claim 16 wherein the photodetecting element is operatively connected to the phase control element bias control device such that the modulation of the phase control element is responsive to the measurement of the output of light from the laser.

19. The wavelength tunable semiconductor vertical cavity surface emitting laser of claim 17 wherein the photodetecting element is operatively connected to the phase control element bias control device such that the modulation of the phase control element is responsive to the measurement of the output of light from the laser.

20. The wavelength tunable semiconductor vertical cavity surface emitting laser of claim 16 wherein the photodetecting element is operatively connected to the equalizing element bias control device such that the modulation of the equalizing element is responsive to the measurement of the output of light from the laser.

21. The wavelength tunable semiconductor vertical cavity surface emitting laser of claim 17 wherein the photodetecting element is operatively connected to the equalizing element bias control device such that the modulation of the equalizing element is responsive to the measurement of the output of light from the laser.

22. The wavelength tunable semiconductor vertical cavity surface emitting laser of claim 18 wherein the photodetecting element is operatively connected to the equalizing element bias control device such that the modulation of the equalizing element is responsive to the measurement of the output of light from the laser.

23. The wavelength tunable semiconductor vertical cavity surface emitting laser of claim 19 wherein the photodetecting element is operatively connected to the equalizing element bias control device such that the modulation of the equalizing element is responsive to the measurement of the output of light from the laser.

24. A wavelength tunable semiconductor vertical cavity surface emitting laser comprising:
   a) a substrate;
   b) a bottom mirror formed by a Bragg reflector region above the substrate;
   c) an active element that includes:
      i) a light generating layer that emits light when a current is injected,
      ii) a first n-doped current spreading region above the substrate and below the light generating layer,
      iii) a first p-doped current spreading region above the light generating layer,
      iv) a first current aperture placed between each neighboring region, and
      v) an active element bias control device between the n-doped current spreading region and the p-doped current spreading region such that current can be injected into the light generating layer to generate light;
   d) a first phase control element that includes:
      i) a first modulating layer located above the first p-doped current spreading region that modulates the wavelength of light when exposed either to an electric field when a reverse bias is applied, or to an injection current when a forward bias is applied due to position-dependent electro-optical effect,
      ii) a second n-doped current spreading region above the modulating layer,
      iii) a second current aperture placed between each neighboring region, and
      iv) a first phase control element bias control device between the second n-doped current spreading region and the first p-doped current spreading region such that an electrical field can be created that causes the first modulating layer to modulate the wavelength of light; and
   c) a second phase control element that includes:
      i) a second modulating layer that is located above the second n-doped current spreading region that modulates the wavelength of light when exposed either to an electric field when a reverse bias is applied, or to an injection current when a forward bias is applied due to position-dependent electro-optical effect, wherein the second modulating layer is set to produce a shift of the wavelength of the emitted light into the opposite direction of the spectrum with respect to the first modulating layer,
      ii) a second p-doped current spreading region above the modulating layer,
      iii) a third current aperture placed between each neighboring region, and
      iv) a second phase control element bias control device between the second n-doped current spreading region and the second p-doped current spreading region such that an electrical field can be created that causes the second modulating layer to modulate the wavelength of light; and
   f) a top mirror formed by a Bragg reflector region above the second p-doped current spreading region.

25. The wavelength tunable semiconductor vertical cavity surface emitting laser of claim 24 further comprising a photodetecting element capable of measuring the output of light from the laser.

26. The wavelength tunable semiconductor vertical cavity surface emitting laser of claim 25 wherein the photodetecting element is operatively connected to the active element bias control device such that output of the active element is responsive to the measurement of the output of light from the laser.

27. The wavelength tunable semiconductor vertical cavity surface emitting laser of claim 25 wherein the photodetecting element is operatively connected to the first phase control element bias control device such that the modulation of the first phase control element is responsive to the measurement of the output of light from the laser.

28. The wavelength tunable semiconductor vertical cavity surface emitting laser of claim 26 wherein the photodetecting element is operatively connected to the first phase control element bias control device such that the modulation of the first phase control element is responsive to the measurement of the output of light from the laser.

29. The wavelength tunable semiconductor vertical cavity surface emitting laser of claim 25 wherein the photodetecting element is operatively connected to the second phase control element bias control device such that the modulation of the second phase control element is responsive to the measurement of the output of light from the laser.

30. The wavelength tunable semiconductor vertical cavity surface emitting laser of claim 26 wherein the photodetecting element is operatively connected to the second phase control element bias control device such that the modulation of the second phase control element is responsive to the measurement of the output of light from the laser.

31. The wavelength tunable semiconductor vertical cavity surface emitting laser of claim 24 wherein the active element bias control device applies a forward bias.

32. The wavelength tunable semiconductor vertical cavity surface emitting laser of claim 24 wherein the first phase control element bias control device applies a reverse bias.

33. The wavelength tunable semiconductor vertical cavity surface emitting laser of claim 24 wherein the first phase control element bias control device applies a forward bias.

34. The wavelength tunable semiconductor vertical cavity surface emitting laser of claim 24 wherein the second phase control element bias control device applies a reverse bias.

35. The wavelength tunable semiconductor vertical cavity surface emitting laser of claim 24 wherein the second phase control element bias control device applies a forward bias.

36. The wavelength tunable semiconductor vertical cavity surface emitting laser of claim 24 further comprising:
   g) an equalizer element that includes:
      i) an absorbing layer that absorbs light when exposed to an electric field and is located above the second p-doped current spreading region,
      ii) a third n-doped current spreading region above the absorbing layer,
      iii) a fourth current aperture placed between each neighboring region, and
      iv) an equalizer element bias control device between the second p-doped current spreading region and the third n-doped current spreading region such that an electrical field can be created that causes the absorbing layer to absorb light in response to the electrical field.

37. The wavelength tunable semiconductor vertical cavity surface emitting laser of claim 36 wherein the equalizer element bias control device applies a reverse bias.

38. The wavelength tunable semiconductor vertical cavity surface emitting laser of claim 36 wherein the equalizer element bias control device applies a forward bias.

39. The wavelength tunable semiconductor vertical cavity surface emitting laser of claim 36 further comprising a photodetecting element capable of measuring the output of light from the laser.

40. The wavelength tunable semiconductor vertical cavity surface emitting laser of claim 39 wherein the photodetecting element is operatively connected to the active element bias control device such that output of the active element is responsive to the measurement of the output of light from the laser.

41. The wavelength tunable semiconductor vertical cavity surface emitting laser of claim 39 wherein the photodetecting element is operatively connected to the first phase control element bias control device such that the modulation of the first phase control element is responsive to the measurement of the output of light from the laser.

42. The wavelength tunable semiconductor vertical cavity surface emitting laser of claim 40 wherein the photodetecting element is operatively connected to the first phase control element bias control device such that the modulation of the first phase control element is responsive to the measurement of the output of light from the laser.

43. The wavelength tunable semiconductor vertical cavity surface emitting laser of claim 39 wherein the photodetecting element is operatively connected to the second phase control element bias control device such that the modulation of the second phase control element is responsive to the measurement of the output of light from the laser.

44. The wavelength tunable semiconductor vertical cavity surface emitting laser of claim 40 wherein the photodetecting element is operatively connected to the second phase control element bias control device such that the modulation of the second phase control element is responsive to the measurement of the output of light from the laser.

45. The wavelength tunable semiconductor vertical cavity surface emitting laser of claim 39 wherein the photodetecting element is operatively connected to the equalizing element bias control device such that the modulation of the equalizing element is responsive to the measurement of the output of light from the laser.

46. The wavelength tunable semiconductor vertical cavity surface emitting laser of claim 40 wherein the photodetecting element is operatively connected to the equalizing element bias control device such that the modulation of the equalizing element is responsive to the measurement of the output of light from the laser.

47. The wavelength tunable semiconductor vertical cavity surface emitting laser of claim 41 wherein the photodetecting element is operatively connected to the equalizing element bias control device such that the modulation of the equalizing element is responsive to the measurement of the output of light from the laser.

48. The wavelength tunable semiconductor vertical cavity surface emitting laser of claim 42 wherein the photodetecting element is operatively connected to the equalizing element bias control device such that the modulation of the equalizing element is responsive to the measurement of the output of light from the laser.

49. The wavelength tunable semiconductor vertical cavity surface emitting laser of claim 43 wherein the photodetecting element is operatively connected to the equalizing element bias control device such that the modulation of the equalizing element is responsive to the measurement of the output of light from the laser.

50. The wavelength tunable semiconductor vertical cavity surface emitting laser of claim 44 wherein the photodetecting element is operatively connected to the equalizing element bias control device such that the modulation of the equalizing element is responsive to the measurement of the output of light from the laser.

51. The wavelength tunable semiconductor vertical cavity surface emitting laser of claim 14 wherein the phase control element bias is set to shift the wavelength of the emitted light towards longer wavelengths.

52. The wavelength tunable semiconductor vertical cavity surface emitting laser of claim 14 wherein the phase control element bias is set to shift the wavelength of the emitted light towards shorter wavelengths.

53. The wavelength tunable semiconductor vertical cavity surface emitting laser of claim 15 wherein the phase control element bias is set to shift the wavelength of the emitted light towards longer wavelengths.

54. The wavelength tunable semiconductor vertical cavity surface emitting laser of claim 15 wherein the phase control element bias is set to shift the wavelength of the emitted light towards shorter wavelengths.

* * * * *